United States Patent

[11] 3,618,074

[72] Inventors John W. Brean
Cincinnati, Ohio;
Paul P. Stiedle, Little Rock, Ark.
[21] Appl. No. 698,739
[22] Filed Jan. 18, 1968
[45] Patented Nov. 2, 1971
[73] Assignee D. H. Baldwin Company
Cincinnati, Ohio

[54] OPTICAL ENCODER
5 Claims, 5 Drawing Figs.

[52] U.S. Cl. .................... 340/347 P
[51] Int. Cl. .................... G08c 9/06
[50] Field of Search .................... 340/347

[56] References Cited
UNITED STATES PATENTS

| | | | |
|---|---|---|---|
| 3,020,534 | 2/1962 | Jones | 340/347 |
| 3,143,730 | 8/1964 | McIntyre | 340/347 |
| 3,238,524 | 3/1966 | Oddo et al. | 340/347 |
| 3,247,505 | 4/1966 | Coyle | 340/347 |
| 3,247,506 | 4/1966 | Grim, Jr. | 340/347 |
| 3,257,656 | 6/1966 | Gotz et al. | 340/347 |

*Primary Examiner*—Maynard R. Wilbur
*Assistant Examiner*—Charles D. Miller
*Attorney*—Burmeister, Palmatier & Haney

ABSTRACT: This application discloses an analog to digital shaft angle encoder of the photoelectric type.

The encoder utilizes a code disc having a plurality of coaxial tracks of alternate transparent and opaque sectors. The code disc is disposed between a light source and a photocell assembly which utilizes a separate photocell confronting the least significant track of the code disc and a pair of photocells confronting each of the more significant tracks of the code disc. Only one of the photocells of the more significant tracks of the code disc is selected by a chain of cascade inverter stages in accordance with the output of the preceding less significant track of the code disc. The encoder includes an electronics unit coiled upon a flexible strip and affixed within a common housing.

Inventors:
John W. Brean
Paul P. Stiedle
By: Burmeister, Kulie
Southard & Dodula
Attorneys Inventors:
John W. Brean
Paul P. Stiedle
By: Burmeister, Kulie, Southard & Dodula
Attorneys Inventors:
John Brean
Paul P. Stiedle
By: Burmeister, Kulie
Southard & Dodula
Attorneys

OPTICAL ENCODER

The present invention relates to analog to digital shaft angle encoders, and more specifically to photoelectric encoders.

Digital computers require inputs in digital form, and shaft angle analog to digital encoders are employed to convert the angular position of a shaft to a digital output suitable for use in a computer. Two types of shaft angle analog to digital encoders have been in relatively wide use. The brush type of converter utilizes a rotatable drum or disc mounted on the shaft to be encoded and provided with a plurality of tracks of conducting areas spaced by nonconducting areas. Each of the tracks of the rotatably member is read by a brush which slidably engages the track so that the converter produces a unique output for a plurality of sectors which extend from a zero position throughout one or more revolutions of the shaft. The second type of shaft angle digital encoder in common use is the photoelectric encoder is in which a code disc is mounted on the shaft to be encoded and provided with a plurality of coaxial tracks of alternate transparent and opaque sectors. A light source is disposed on one side of the code disc, and separate photocells are mounted confronting each track of the code disc on the opposite side of the light source and in alignment with the light source. While portions of the present invention are suitable for use with brush-type encoders, the present invention is primarily concerned with photoelectric encoders.

Photoelectric encoders are capable of greater resolution than brush-type encoders, but photoelectric encoders have been substantially higher in cost. It is one of the objects of the present invention to provide a photoelectric encoder which is inherently less costly than the photoelectric encoders heretofore known to the art.

One of the costly features of photoelectric encoders presently known to the art is the necessity for precise alignment of the optical elements of the encoder. Conventionally the photocells of the encoder are disposed on a straight axis in an assembly, and the assembly is precisely mounted on a radius of the code disc with a different photocell confronting each of the tracks of the code disc, and errors in alignment or positioning of the photocells result in erroneous readings from the encoder. Generally the photocells are of relatively large sensitive areas compared to the sector length of the transparent sectors of the least significant track of the code disc, namely the shortest sectors, and a slit-defining member is generally disposed between the photocell assembly and the code disc to confine light passing through the code disc to a single plane. The slit must also be precisely aligned with a radius of the code disc and with the readout axis of the photocell assembly. An alternative to use of the slit is the use of a lens, but the lens also must be precisely aligned with the readout axis of the photocell assembly and with a radius of the code disc. It is an object of the present invention to provide a photoelectric shaft angle encoder which permits looser tolerances in positioning of the photocell assembly.

It has been known in brush-type encoders to utilize the V-scan method of readout in which the least significant track of the code member is sensed by a single brush and the more significant tracks of the code disc are sensed by two brushes which are spaced to a lag and a lead position on the track of the code member. An electronic selection unit is utilized to select either the lead or the lag readout brush in accordance with the output of the immediately less significant track of the code member. V-scan methods have been limited in use with photoelectric encoders because the additional cost of conventional optics and conventional electronics have been excessive with such systems. One of the elements of additional cost results from the fact that the spacing of the photocells confronting the more significant tracks of the code disc becomes relatively large, necessitating complicated or plural light sources. It is an object of the present invention to provide a V-scan method for a photoelectric encoder requiring but a single light source of simple construction.

It is also an object of the present invention to provide a V-scan type encoder with a unit for selecting the lead or lag readout device which is of simplified and less costly design than such devices known heretofore.

For a better understanding of the present invention, together with other and further objects thereof, reference is made to the following description taken in connection with the accompanying drawings, in which.

Figure 1:
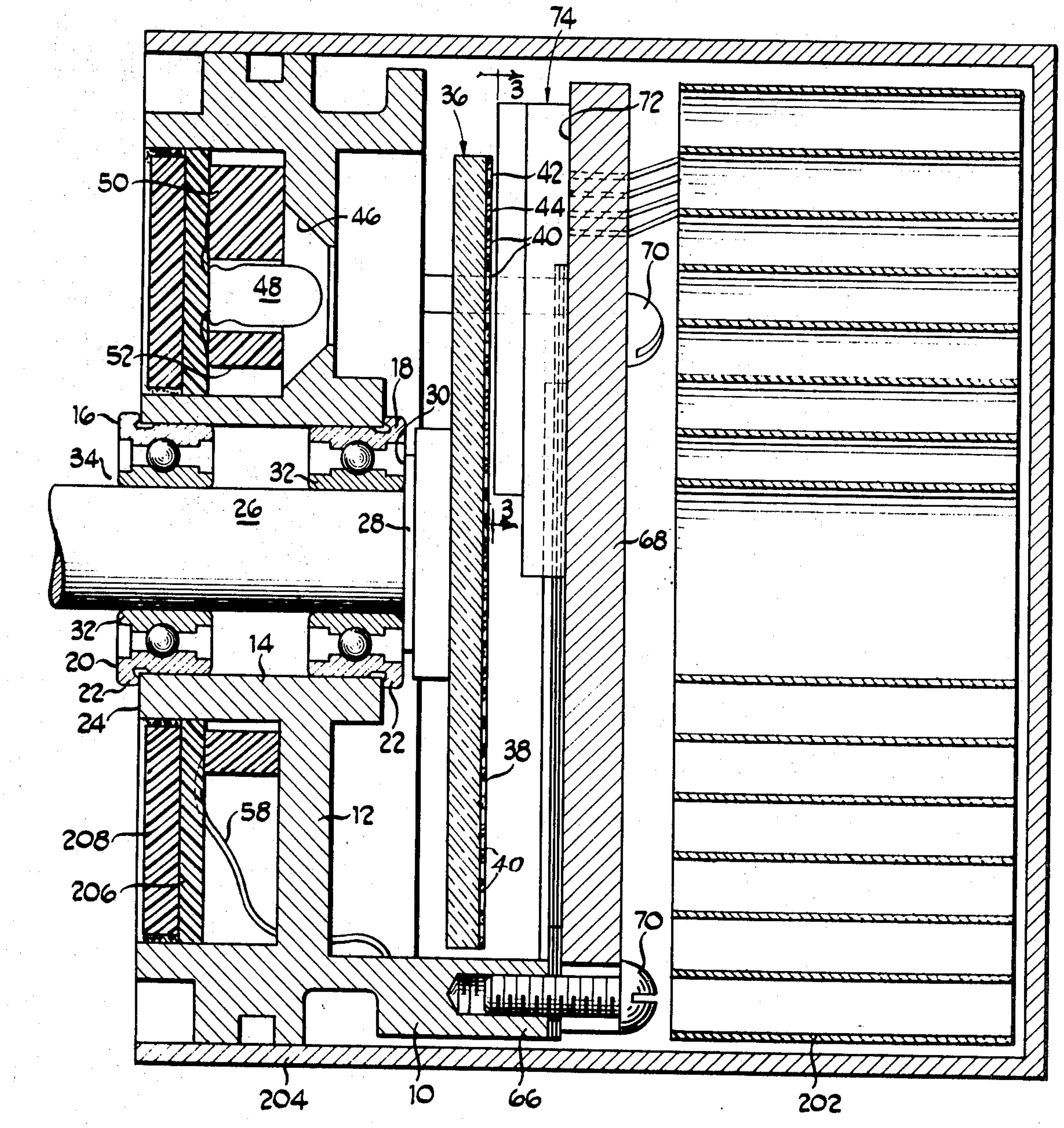
FIG. 1 is a sectional view of an encoder constructed according to the present invention, the section being taken along the axis of the shaft to be encoded.
Figure 2:
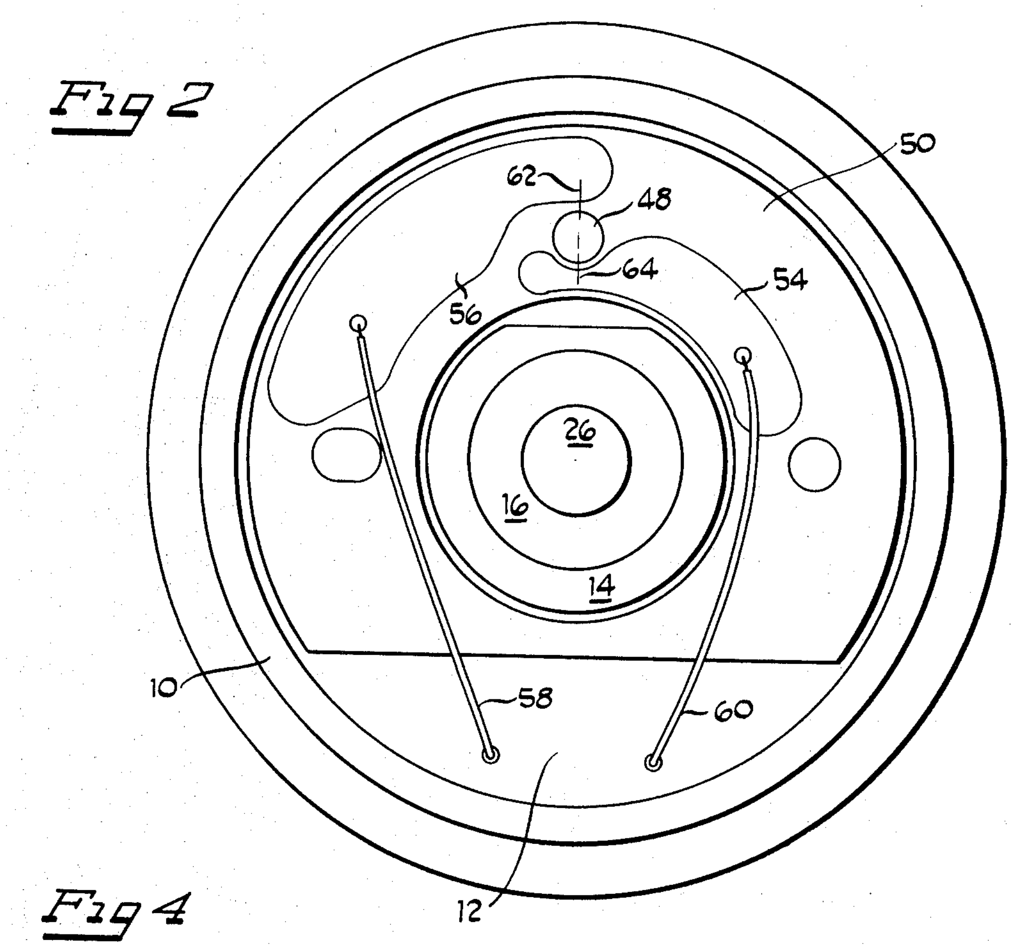
FIG. 2 is an end elevational view of the encoder of FIG. 1, the cover having been removed for illustrative purposes.
Figure 3:
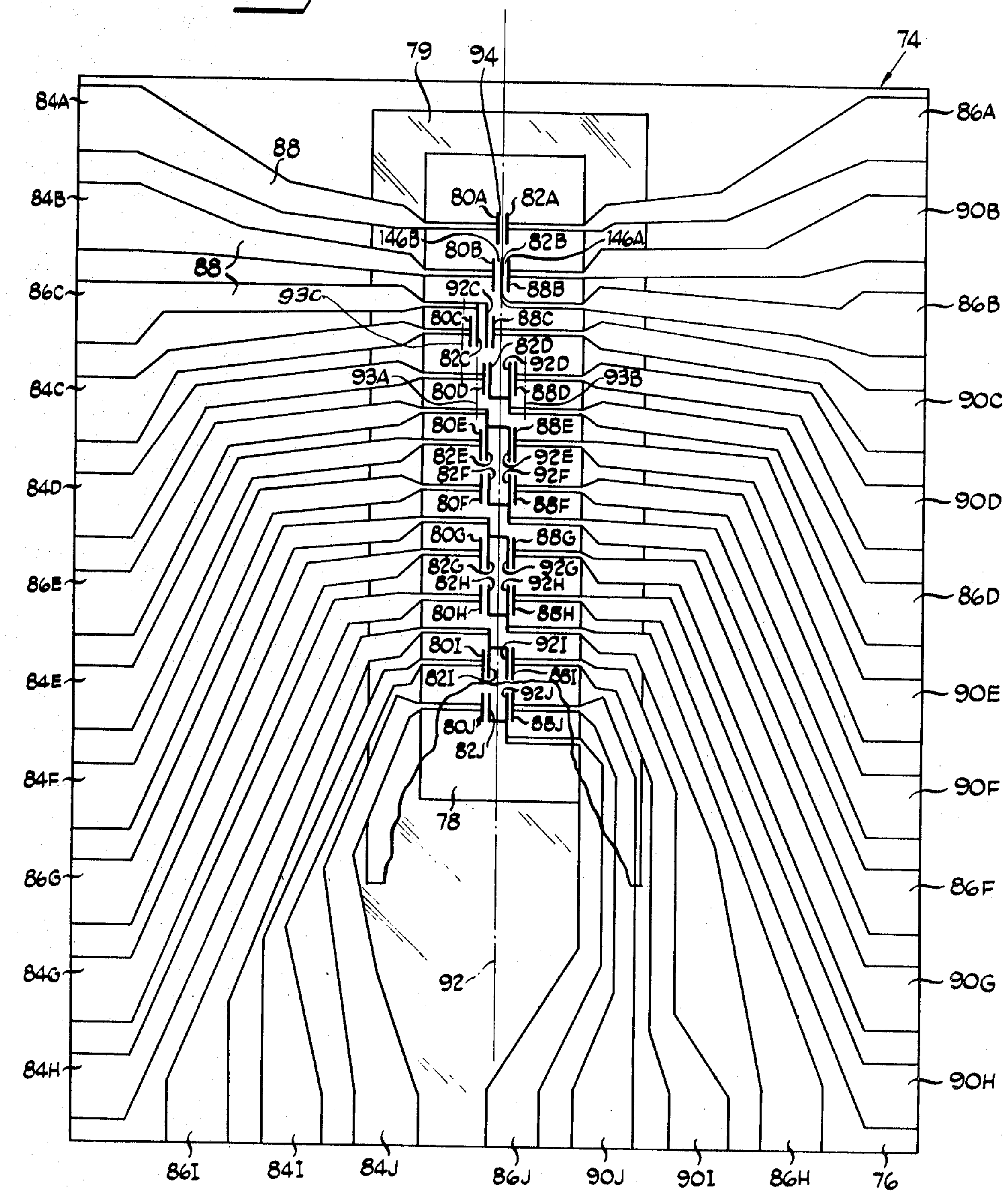
FIG. 3 is a sectional view taken along the line 3—3 of FIG. 1.

As indicated in FIGS. 1 through 3, the analog to digital encoder has a cylindrical shell 10 which has integrally therewith a wall 12 normal to the axis of the cylindrical shell 10. The wall 12 is integral with a sleeve 14 disposed coaxially about the axis of the shell 10, and two ball bearing assemblies 16 and 18 are mounted within the sleeve 14. Each of the ball bearing assemblies 16 and 18 has an outer race 20 provided with an outwardly extending annular flange 22 which abuts one of the ends 24 of the sleeve 14. In this manner, the outer race 20 of the ball bearing assemblies 16 and 18 are restricted in their movement toward each other.

A rotatable shaft 26 is disposed within the ball bearing assemblies 16 and 18 to transmit the analog information from a movable element to a code member, and the shaft is provided with an outwardly extending hub 28 at one end which has a surface 30 abutting the inner race 32 of the ball bearing assembly 18. The inner race 32 of the ball bearing assembly 16 is securely affixed on the shaft 26, as by cement 34, and the inner races 32 of the ball bearing assemblies 16 and 18 are urged toward each other by pretensioning the inner races 32 prior to applying the cement 34, thereby reducing the free play of the ball bearing assemblies 16 and 18.

Figure 5:
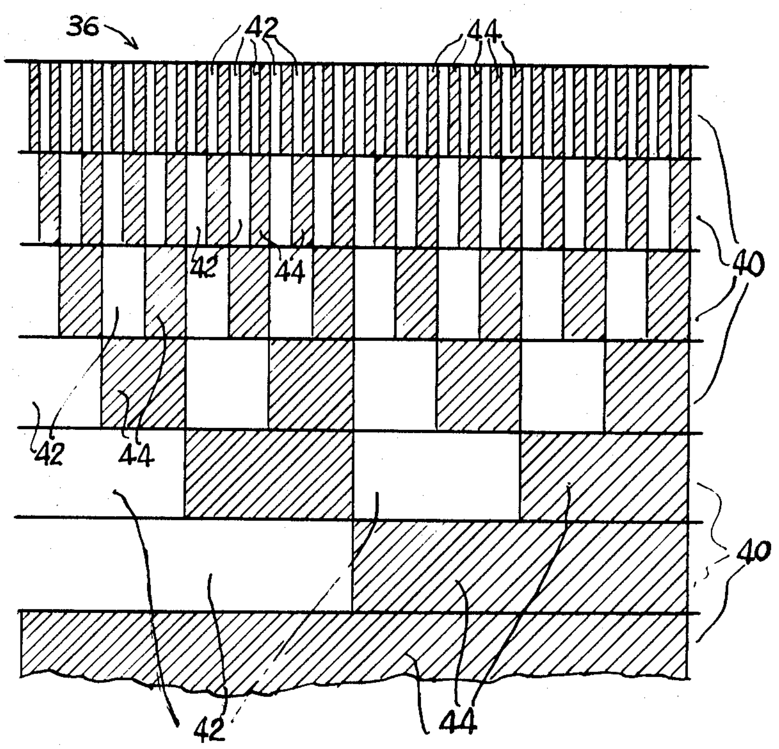
FIG. 5 is a diagrammatic fragmentary enlarged developed view of the digital code tracks employed on the code disc of the encoder.

A code member in the form of a disc 36 which is circular in form is affixed on the hub 28 coaxially about the shaft 26. The code member could also be in the form of a translational member or a rotatable cylinder, if desired, but a disc is usually preferable. The code disc 36 is constructed of transparent material, such as glass, and is provided with an opaque layer 38 on its surface remote from the shaft 26. The opaque layer 38 may be an exposed photographic emulsion, and it is provided with a plurality of tracks 40 which extend coaxially about the axis of the shaft 26. Several of the tracks 40 are shown diagrammatically in FIG. 5, which is a fragmentary enlarged elevational view in which the tracks are developed or straightened out for clarity of illustration. Each of the tracks 40 is divided into a plurality of transparent sectors 42 spaced by opaque sectors 44 to form a code disc, and the transitions between the sectors are along axes normal to the track, which in the case of a disc are radial. The particular code disc utilized in the encoder of the present invention is a so-called natural binary disc, such as shown on page 6–41 of "NOTES ON ANALOG-DIGITAL CONVERSION TECHNIQUES" by Alfred K. Susskind copyright 1957 by the Massachusetts Institute of Technology.

The wall 12 of the shell 10 is provided with an opening 46 which confronts one side of the code disc 36. A lamp 48 is mounted on a disc 50 of electrically insulating material which is disposed within the shell 10 and has a circular aperture 52 surrounding the sleeve 14 in order to position the lamp 48 within the opening 46. The disc 50 is provided with two electrically conducting lands 54 and 56, and a pair of conductors 58 and 60 make contact with the lands 54 and 56. The lamp 48 has two terminals 62 and 64 which are electrically connected to the lands 56 and 54, respectively. The conductors 58 and 60 are connected to a source of direct current in order to maintain the lamp 48 in continuous illumination.

The shell 10 is provided with a plurality of outwardly extending posts 66, and a circular plate 68 abuts the end of the posts 66 on the opposite side of the code disc 36 from the shell 10. The plate 68 is secured in position by a bolt 70 threadably engaging each of the posts 66. One of the surfaces of the plate 68, designated 72, confronts the code disc 36, and a photocell assembly 74 is mounted on the surface 72 confronting the code disc 36 in a region aligned with the lamp 48. The photocell assembly 74 is illustrated in FIG. 3, and has a photocell confronting each of the tracks 40 of the code disc 36 in alignment with the lamp 48.

As illustrated in FIG. 3, the photocell assembly 74 has a base plate 76 of electrically insulating material, such as glass. A strip of photoconductive material 78 is disposed upon the base 76 and generally oriented parallel to a radius of the code disc 36. A layer 79 of light-permeable, air-impermeable material, such as glass, is disposed over the strip 78 to protect it from the ambient atmosphere. The photoconductive layer 78 is preferably a composition formed by any combination of a cation material from the group consisting of cadmium, lead, indium, mercury, gallium, zinc and aluminum, with an anion material from the group consisting of sulfur, selenium, tellurium, antimony, and arsenic. Cadmium selenide has been found to be particularly desirable material for the layer 78 of photoconductive material. A pair of electrodes designated 80A and 82A are disposed confronting the outermost or least significant track 40 of the code disc 36, and these electrodes 80A and 82A are disposed upon the layer 78 of photoconductive material and spaced by a distance no greater than the sector length of the transparent sectors of the outermost track 40 of the code disc 36. The electrodes 80A and 82A are in the form of thin films of electrically conducting material disposed on the layer 78 of photoconductive material, and the electrodes 80A and 82A are connected to terminal lands 84A and 86A, respectively, by strips 88 of electrically conducting material which extend from the electrodes across the photoconductive material 78 and the base 76.

A pair of photoconductive cells are formed by three electrodes designated 80B, 82B, and 88B, and this pair of photoconductive cells confronts the track immediately inwardly of the least significant track of the code disc 36. Electrode 80B, is connected to a terminal land 84B by an electrically conducting strip 88, and the electrode 82B is connected to a terminal land 86B by an electrically conducting strip 88. In like manner, electrode 88B is connected to a terminal land 90B by an electrically conducting strip 88.

The photocell assembly 74 also has a pair of photoconductive cells confronting the track 40 of the code disc disposed two tracks inwardly from the least significant track of the code disc. These photocells are formed by two pair of electrodes, the one pair being designated 80C and 82C, and the other pair being designated 88C and 92C. The electrodes 82C and 92C are electrically interconnected and connected to a terminal land 86C by an electrically conducting strip 88 disposed on the layer 78 of photoconductive material and the base 76 of electrically insulating material. In like manner, the electrode 80C is electrically connnected to a terminal land 84C, and the electrode 88C is electrically connected to a terminal land 90C.

The fourth track inwardly from the periphery of the code disc 36 also has a pair of photoconductive cells confronting it, and this pair of photoconductive cells are formed by four electrodes designated 80D, 82D 92D and 88D. These electrodes are electrically connected to terminal lands designated 84D, 86D and 90D, respectively.

In like manner, the fifth track inwardly from the periphery of the code disc 36 confronts a pair of photoconductive cells of the photocell assembly 74, and these photocells are formed by four electrodes designated 80E, 82E, 92E and 88E, and these electrodes are electrically connected to terminal lands at the periphery of the base 76 designated 84E, 86E, and 90E, respectively. In like manner, a pair of photoconductive cells confronts the next track of greater significance and are formed by electrodes designated 80F, 82F, 92F and 88F, and these electrodes are electrically connected to terminal lands designated 84F, 86F and 90F, respectively.

A pair of photoconductive cells also confront the next track of the code disc of greater significance, and this pair of photocells is formed by two pair of electrodes designated 80G, 82G, 92G and 88G, and these electrodes are electrically connected to terminal lands designated 84G, 86G and 90G, respectively.

A pair of photoconductive cells also confront the next more significant track of the code disc 36, and this part of photocells is formed by electrodes designated 80H, 82H, 92H and 88H, and these electrodes are electrically connected to terminal lands designated 84H, 86H and 90H, respectively.

There are two additional inner tracks of the code disc 36 in the particular embodiment set forth, and the next most significant track also has a pair of photoconductive cells formed by electrodes 80I, 82I, 92I and 88I, which are electrically connected to terminal lands designated 84I, 86I, and 90I, respectively. The pair of photocells confronting the innermost or most significant track of the code disc are formed by electrodes 80J, 82J, 92J and 88J, and these electrodes are electrically connected to terminal leads designated 84J, 86J and 90J, respectively.

The purpose of utilizing a pair of photoconductive cells confronting each of the tracks of the code disc 36 except the least significant track thereof, is to provide a lag and a lead photocell output. The code disc 36 is encoded with the natural binary code, and as is well known, such a code disc provides transitions in a plurality of tracks at the same time, hence increasing the probability of ambiguity over the Gray or reflected code disc if read with a simple in-line array of photocells. The natural binary code disc, however, has the advantage of producing an output which is directly usable and does not require conversion. Hence, it has been conventional in brush-type encoders to provide a V-brush method of readout, as described in "NOTES ON ANALOG-DIGITAL CONVERSION TECHNIQUES," edited by Alfred K. Susskind, Massachusetts Institute of Technology, 1957. The so-called V-brush method referred to on page 6–45 of this text, utilizes a single brush on the least significant track, and spaced brushes on each of the inner tracks at ever diverging distances to provide a lag and a lead readout. A selecting mechanism is used in the output of such an encoder to select the proper brush. If the digit in the next track of lesser significance is one, then the selecting mechanism selects the brush toward decreasing count, called the lagging brush, for that particular track; and if the digit in the immediately preceding track of lesser significance is zero, then the selecting mechanism selects the brush toward advancing count, called the leading brush.

Under the V-brush method of reading a code disc, the spacing of the lagging and leading brushes is increased with increasing significance of the code track. It is conventional to space the lagging and leading brushes by a distance of approximately one half the sector length in each track, thus positioning the brushes on the legs of an outwardly flaring V. Such a system is applied to an optical encoder, however, would require a plurality of light source or a complex optical system. The photocell for the least significant track of the code disc, formed by the electrodes 80A and 82A, determines the readout axis of the encoder, and FIG. 3 has designated this readout axis by the reference numeral 92. The conventional V-brush reading method disposes the lagging and leading brushes on opposite sides of the readout axis, but in accordance with the present invention, the pairs of photocells are merely clustered about the readout axis 92, and may in fact both be on the same side of the readout axis. Considering clockwise rotation of the code disc 36 as viewed in FIG. 3 to increase the count, the photoconductive cells to the left side of the readout axis 92 for the six most significant digits are lead photocells, while the photocells to the right of the readout axis 92 for the six most significant digits are lag photocells. However, the pair of photocells confronting the seventh most significant digit operates on two separate spaced readout axis designated 93A and 93B so that the photocell formed by the electrodes 80D and 82D is disposed to the right-hand or lag side of one of the readout axis 93A, while the electrodes designated 92D and 88D are disposed to the left or lead side of the other of the readout axes 93B, each of the axes 93A and 93B being spaced by an even number of sector lengths from the axis 92. In like manner, the eighth most significant digit of the code disc 36 is read by a a pair of photocells disposed at opposite sides of the readout axis 92 and still different readout axis 93C disposed an even multiple of sector lengths from the axis 92 the transparent sectors 42 and opaque sectors 44 being of equal length. The photocell formed by the electrodes 80C and 82C is disposed on the right side of the new readout axis 93C to form a lag output, and the photocell formed by the electrodes 92C and 88C is disposed on the left side of the original readout axis 92 to form a lead output.

The track adjacent to the least significant track of the code disc is also read from two spaced readout axes. Wherever two readout axes are employed, the axes must be spaced by an even multiple of the sector length of the track being read. In the case of the second least significant track of the code disc, the electrodes 80B and 82B are disposed to the left of one of the readout axes to form a lead output on the terminal 84B, and the electrodes 82B and 88B are disposed to the right of the other readout axis to form a lag output on the terminal 90B. The electrode 82B serves with both of the photocells confronting this second least significant track of the code disc, and has a proper width to position the two photocells properly with respect to the second least significant track of the code disc.

Optical encoders conventionally utilize a readout slit between the code disc and photocell assembly to improve the resolution of the encoder by restricting illumination of the photocells to precise alignment with the readout axis on a radius of the code disc. A readout slit, or lens system, becomes cumbersome when utilizing more than one readout line. In accordance with the present invention, no slit, lens, or other optical elements are interposed between the code disc and the photocell assembly, and the proper resolution is obtained by restricting the distance between the electrodes of the photocells. In this manner, different tracks of the code disc may be readout along different axes, or a plurality of different axes, without rendering cumbersome the optical system of the encoder, and further, permitting the use of a single light source. U.S. Pat. No. 3,076,959 issued to William Pong entitled "Encoder" teaches the use of photoconductive cells in an encoder with sensitive areas less than the sector length of the transparent areas of the code disc to eliminate optical elements, and the present invention extends this concept to provide a low-cost V-scan photoelectric encoder, however, the present invention requires the distance between the electrodes of the lead and lag photocells to be less than one-half of the sector length of the transparent sectors of the confronting track of the code disc 36.

Figure 4:
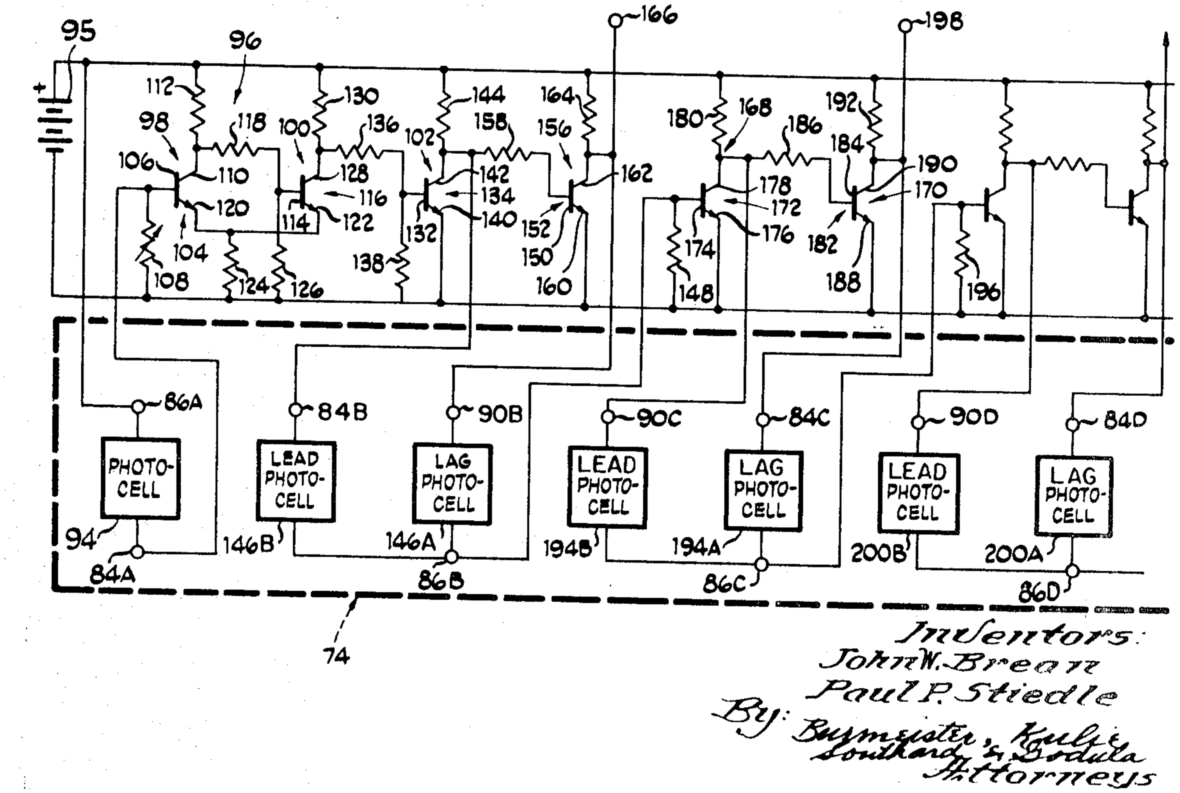
FIG. 4 is a schematic electrical circuit diagram of the encoder of FIGS. 1 through 3.

FIG. 4 schematically illustrates the electronic circuit for selecting the lead or lag photocell confronting the tracks of the encoder. The photocell formed by the electrodes 80A and 82A and confronting the least significant track of the code disc is designated 94 in FIG. 4. Terminal land 86A of the photocell 94 is connected to the positive terminal of a direct current power source 95 in the form of a battery, and terminal land 84A is connected to the input of an amplifier 96. The amplifier 96 utilizes two transistor stages 98 and 100 followed by an inverter stage 102.

The amplifier stage 98 has a transistor 104 with a base 106 which forms the input terminal and is connected to the terminal land 84A of the photocell 94. The base 106 also is connected to the negative terminal of the power source 95 through an adjustable resistor 108, the negative terminal of the power source 95 forming a common or ground terminal for the entire electronics unit. The transistor 104 also has a collector 110 connected to the positive terminal of the power source 95 through a resistor 112 and to the base 114 of a second transistor 116 in the stage 100 through a resistor 118. Transistor 106 has an emitter 120 which is connected to an emitter 122 of the transistor 116 and also the negative terminal of the power source 95 through a resistor 124. The base 114 of the transistor 116 is also connected to the negative terminal of the power source 95 through a resistor 126. Also, the transistor 116 has a collector 128 connected to the positive terminal of the power source 95 through a resistor 130.

The collector 128 of the transistor 116 forms an output terminal for the stage 100 and is electrically connected to the base 132 of a transistor 134 of the inverter 102 through a resistor 136. The base 132 of transistor 134 is also connected to the negative terminal of the power source 95 through a resistor 138. Transistor 134 has an emitter 140 which is connected to the negative terminal of the power source 95, and a collector 142 which is connected to the positive terminal of the power source 95 through a resistor 144.

The photocell 94 is constantly monitoring the illumination incident on the sensitive area of the photocell, and hence the photocell 94 presents either a high resistance between the positive terminal of the power source 95 and the base 106 (when the photocell 94 is not illuminated), or a low resistance between the positive terminal of the power source 95 and the base 106 of the transistor 104 (when the photocell 94 is illuminated). Considering first the photocell 94 to be illuminated, then the base 106 is placed at a relatively high positive potential causing an increased flow of current through the collector-emitter circuit of the transistor 104. Hence, the base 114 of the transistor 116 is placed at a relatively low potential, causing a relatively small flow of current in the emitter-collector circuit of the transistor 116. As a result of the relatively small flow of current through the transistor 116, the base 132 of the inverter's transistor 134 is placed at a relatively high positive potential, resulting in a relatively large flow of current through the collector-emitter circuit of the transistor 134. The potential of the collector 142 is thus relatively low, due the voltage drop across the resistor 144. As indicated in FIG. 4, one of the photocells of the second least significant track, designated 146B is connected in a series circuit from the collector 142 to the negative terminal of the power source 95 which includes the resistor 148. Since the potential of the collector 142 is low, the photoconductive cell 146B will not be actuated and a voltage drop will not be developed across the resistor 148 whether the photoconductive cell 146B is illuminated or not. This is precisely the condition that is desired at the leading photocell of the second least significant track, since a transition in the least significant track from a "0" to a "1" should not select the leading photocell of the second least significant digit, but rather the lagging photocell thereof.

However, the collector 142 of the transistor 134 is connected to base 150 of a transistor 152 connected in a second inverter circuit 156 through a resistor 158. The transistor 152 has an emitter 160 connected to the negative terminal of the power source 95 and a collector 162 connected to the positive terminal of the power source through a resistor 164. The second photocell 146A of the pair confronting the second least significant track is connected in a series circuit from the collector 162 of the inverter 156 to the negative terminal of the power source 95 through the resistor 148. The relatively low potential of the collector 142 of the inverter 102 results in a low potential on the base 150 of the transistor 152. Hence, a relatively small current flows through the collector-emitter circuit of the transistor 152, and the potential of the collector 162 is relatively high. Since the photocell 146A is connected between the collector 162 and the negative terminal of the power source 95 through resistor 148, the photocell 146A is in a condition to respond to illumination, and if illuminated, will present a relatively low resistance resulting in a flow of current through the resistor 148. If the photocell 146A is not illuminated, then its high resistance will prevent the flow of a significant current through the resistor 148. It will be recognized that this is precisely the condition required for the lag photocell confronting the second least significant track of the code disc 36.

The output for the least significant track of the code disc 36, as read by the photocell 94, appears in its amplified form on the collector 162 of the transistor 152, and hence the output terminal 166 for the least significant track is connected to the collector 162. The potential developed across the resistor 148 is responsive to whether or not the active photocell 146A or 146B is illuminated. An inverter 168 has its input connected across the resistor 148, and the inverter 168 is electrically coupled to a second inverter 170. The inverter 168 has a transistor 172 with a base 174 which forms the input terminal for the inverter, and an emitter 176 connected to the negative terminal of the power source 95. Transistor 172 also has a collector 178 connected to the positive terminal of the power source 95 through a resistor 180.

The inverter 170 has a transistor 182 with a base 184 electrically connected to the collector 178 of the transistor 172 through a resistor 186. The transistor 182 also has an emitter 188 which is connected to the negative terminal of the power source 95, and a collector 190 connected to the positive terminal of the power source 95 through a resistor 192. The lead photocell confronting the third least significant track of the code disc 36, designated 194B is electrically connected in a series circuit extending from the collector 178 of the transistor 172 to the negative terminal of the power source 95 which includes a resistor 196. The lag photocell confronting the third least significant track of the code disc, designated 194A, is connected in a series circuit extending from the collector 190 of the transistor 182 to the negative terminal of the power source 95 and including the same resistor 196. The collector 190 of the transistor 182 is also connected to an output terminal designated 198 which represents the output for the second least significant track of the code disc.

It is to be noted that the inverters 168 and 170 select the lag photocell 194A or the lead photocell 194B depending upon whether or not the output from the second least significant track of the code disc is a "1" or a "0." Further, the output of the photocells confronting the third least significant track of the code disc is impressed across the resistor 196 of the cascaded inverted stages utilized to select the lead or lag photocell confronting the fourth least significant track of the code disc, these photocells being designated 200B and 200A, respectively. In like manner, the photocells confronting each of the increasingly significant tracks of the code disc are connected in a cascade two stage inverter circuit, such as described for the inverters 168 and 170, to select the proper lag or lead photocell in accordance with the output of the immediately less significant track of the code disc 36. In each case, the two inverter stages, such as the stages 168 and 170, generate the output for one track of the code disc 36 and select the lead or lag photocell for the next more significant track of the code disc.

The cascaded inverter stages 168 and 170 are saturated transistor switches in the embodiment here set forth. It is, however, to be understood that other inverters may also be utilized, such as flip-flops, gates, and the like.

As illustrated, the code disc 36 is provided with ten tracks, and hence there must be nine cascaded inverters stages, each stage having two inverters connected in cascade, producing a total of ten electrical outputs. The invention may be practiced, however, with any number of tracks upon the code disc 36, and cascaded inverter stages equal in number to one less than the number of tracks on the code disc 36.

In accordance with the present invention, the amplifier 96, and the cascaded inverter stages driven by the amplifier are mounted on a flexible strip of electrically insulating material designated 202, and the strip 202 is coiled about an axis generally corresponding to the axis of the shaft 26 in order to economically place the components of the electronic unit in a relatively small volume. A cover 204 extends about the strip 202 and is mounted on the shell 10 to enclose and partially seal the encoder from the ambient atmosphere. A flat disc 206 of electrically insulating material is disposed in abutment with the disc 50, and a cover ring 208 is cemented into place to seal the open end of the shell 10 to prevent the atmospheric conditions from contaminating or adversely affecting the encoder.

In assembling the encoder, positioning of the photocell assembly 74 on the plate 68 merely requires positioning of the photoconductive cell 94 in confrontation with the least significant track 40 of the code disc 36 and loose orientation of the axis 92 of the photocell assembly with a radius of the code disc. It is not necessary that the axis 92 be precisely aligned with a radius of the code disc, since all of the tracks of the code disc, with the exception of the least significant track, are read on two readout lines which must merely be disposed on opposite sides of the transition axis for that track. Hence, positioning of the photocell assembly 74 relative to the code disc 36 has been greatly relieved.

While the use of two readout axes for all but the least significant track of the code disc simplifies the positioning of the photocell assembly 74, it would greatly complicate the optical system of the encoder were it not for two factors incorporated in the present invention. First, the two readout axes for each of the tracks of the code disc except the least significant track are clustered about the common axis 92 even though conventional V-brush systems require the two readout axes for the more significant tracks of the code disc to be displaced by substantial distances, thereby facilitating the use of a single light source. Secondly, the use of photocells which have sensitive areas less than one-half of the arc length of the transparent sectors of the confronting tracks permits the use of two readout axes without requiring accurately spaced slits or lenses for each of the more significant tracks of the code disc.

It is also to be noted that the inverters utilized in the electronics unit perform the function of electrical switches, since the inverters apply the necessary potential to activate the photoconductive lead or lag cell for each pair of photocells confronting all but the least significant track of the code disc, thereby actuating the lead or lag cell, in accordance with the teachings of U.S. Pat. No. 3,023,406 of Edward M. Jones. The use of photoconductive cells in combination with a chain of cascaded inverters provides an effective, inexpensive, and space conserving device for optically reading a code disc in accordance with the V-scan method.

Those skilled in the art will readily device many modifications of the present invention and many utilities therefor beyond that here set forth. It is therefore intended that the scope of the present invention be not limited by the foregoing specification, but rather only by the appended claims.

The invention claimed is:

1. A device for digitally encoding the position of a movable element, said device comprising a code member adapted to be mechanically coupled to the movable element to be encoded and to move in either a forward or a reverse direction in response to movement of the element to be coded, said member defining a plurality of generally parallel tracks containing sectors of two types, the sectors of each track being alternately transparent and opaque and being of approximately equal length, said tracks including a least significant track having sectors which are shorter in length along the direction of movement of the code member than the sectors of the other tracks, the length of the sectors of the other of said tracks being different from one another, each of the transparent sectors of said least significant track defining two boundaries extending crosswise of said least significant track at the transitions between said transparent sector and the adjacent opaque sectors, said boundaries dividing the code member into segments, all of the transitions between transparent and opaque sectors on all of the tracks being disposed on said boundaries, each segment of the code member containing at least a portion of a sector of each of the tracks of the code member in a unique combination of transparent and opaque sectors, a light source for illuminating the code member, a first photoconductive photocell disposed opposite the least significant track of the code member for receiving light as modulated by said least significant track, said first photocell being disposed on a first fixed line extending crosswise to the direction of movement of the code member, said tracks including a second track of second least significance, a pair of photoconductive photocells mounted in fixed positions opposite said second track of the code member for receiving light as modulated by said second track, said second track having sectors of a greater length than the sectors of the least significant track but of a lesser length than the sectors of the other tracks of the code member, one photocell of the pair of photocells being disposed on a second line extending crosswise to the direction of movement of said code member, said second line being parallel to but ahead of said first line in relation to the movement of said code member, the other photocell of said pair of photocells being disposed on a third crosswise line which is parallel to but behind the first line in relation to the movement of the code member, each of said photoconductive photocells being conductive in an illuminated condition and nonconductive in a dark condition, and circuit means electrically connected to the photocells for electrically reading the output of said photocells, said circuit means including first and second output terminals, means coupling said first photocell to said first terminal to produce energization of said first terminal in one of said conditions and deenergization of said first terminal in the other of said conditions of said first photocell, an inverter connected between said first and second terminals to energize said second terminal when said first terminal is deenergized while deenergizing said second terminal when said first terminal is energized, and a third output terminal, one photocell of said pair being connected between said first and third terminals whereby said third terminal is energized when said first terminal is energized and the last mentioned photocell is illuminated, the other photocell of said pair being connected between said second and third terminals whereby said third terminal is energized when said second terminal is energized and the last mentioned photocell is illuminated.

2. A device according to claim 1, wherein the code member is a disc and the tracks are circular and are disposed coaxially about the disc.

3. A device according to claim 1, wherein the second and third lines are displaced from each other by a distance greater than the sector length of the second track.

4. A device according to claim 1, wherein each of the photoconductive photocells of the pair of photocells has a sensitive area less than one-half of the sector length of the opaque and transparent sectors of the confronting track of the code member.

5. A device according to claim 1 including a second pair of photoconductive photocells mounted in fixed positions confronting a third track of said tracks on the code member, said third track being of third least significance and having transparent and opaque sectors of a greater length than the sectors of least significant and the second tracks of the code member but of a lesser length than the other tracks of the code member, one photocell of the second pair of photocells being disposed on a fourth crosswise line parallel to but ahead of the first line in relation to the movement of said code member, the other photocell of said second pair of photocells being disposed on a fifth crosswise line parallel to but behind the first line in relation to the movement of said code member, fourth and fifth output terminals, additional means connected between said third terminal and said fourth terminal for energizing and deenergizing said fourth terminal in a predetermined relationship to the energization and deenergization of said third terminal, a sixth output terminal, one photocell of said second pair being connected between said fourth and sixth terminals whereby said sixth terminal is energized when said fourth terminal is energized and the last-mentioned photocell is illuminated, and an inverter connected between said fourth and fifth terminals to energize said fifth terminal when said fourth terminal is deenergized while deenergizing said fifth terminal when said fourth terminal is energized, the other photocell of said second pair being connected between said fifth terminal and said sixth terminal whereby said sixth terminal is energized when said fifth terminal is energized and the last mentioned photocell is illuminated.

* * * * *

PO-1050
(5/69)

UNITED STATES PATENT OFFICE
CERTIFICATE OF CORRECTION

Patent No. 3,618,074 Dated November 2, 1971

Inventor(s) John Brean and Paul Stiedle

It is certified that error appears in the above-identified patent and that said Letters Patent are hereby corrected as shown below:

Column 1, line 18, after "encoder" delete "is"
Column 1, line 19, before "provided" insert -- is --
Column 3, line 27, (actual count) before "particularly" insert -- a --
Column 4, line 26, (actual count) after "terminal" delete "leads" and insert -- lands --
Column 4, line 61, (actual count) after "system" delete "is" and insert -- if --
Column 5, line 13, after "by" delete "a" (first occurrance)
Column 8, line 58 (actual count) "coded" should be "encoded"
Column 8, line 59 (actual count), before "member" insert -- code --

Signed and sealed this 25th day of July 1972.

(SEAL)
Attest:

EDWARD M.FLETCHER,JR.
Attesting Officer

ROBERT GOTTSCHALK
Commissioner of Patents